(12) United States Patent
Stamper et al.

(10) Patent No.: US 10,062,748 B1
(45) Date of Patent: Aug. 28, 2018

(54) SEGMENTED GUARD-RING AND CHIP EDGE SEALS

(71) Applicant: GLOBALFOUNDRIES INC., Grand Cayman (KY)

(72) Inventors: Anthony K. Stamper, Burlington, VT (US); Vincent J. McGahay, Poughkeepsie, NY (US); Zhong-Xiang He, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/443,276

(22) Filed: Feb. 27, 2017

(51) Int. Cl.
  *H01L 23/48* (2006.01)
  *H01L 29/06* (2006.01)
  *H01L 23/31* (2006.01)
  *H01L 23/528* (2006.01)

(52) U.S. Cl.
  CPC ...... *H01L 29/0619* (2013.01); *H01L 23/3171* (2013.01); *H01L 23/528* (2013.01); *H01L 29/0649* (2013.01)

(58) Field of Classification Search
  CPC ............ H01L 29/0619; H01L 23/3171; H01L 29/0649; H01L 23/528
  See application file for complete search history.

(56) References Cited

U.S. PATENT DOCUMENTS

2012/0280401 A1\* 11/2012 Tsutsue ................ H01L 23/564
  257/774

\* cited by examiner

*Primary Examiner* — Long Pham
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to segmented guard-ring and chip edge seals and methods of manufacture. The structure includes: a guard ring structure formed in a low-k dielectric material; and an edge seal structure formed through the low-k dielectric material to at least a substrate underneath the low-k dielectric material.

18 Claims, 7 Drawing Sheets

SEGMENTED GUARD-RING AND CHIP EDGE SEALS

FIELD OF THE INVENTION

The present disclosure relates to semiconductor structures and, more particularly, to segmented guard-ring and chip edge seals and methods of manufacture.

BACKGROUND

Guard ring technologies, e.g., segmented guard rings, are used in many different semiconductor technologies such as GaAs, SiGe, RFCMOS, and RFSOI. For example, radio frequency (RF) circuits require segmented guard rings to avoid parasitic coupling and inductive coupling (the latter phenomenon which can occur with continuous guard rings).

RF technologies typically comprise non-porous dielectric material at the middle of the line (MOL) and back end of the line (BEOL) processes. To make further improvements to RF technologies, e.g., improvements in RF circuitry performance, low-k dielectric, porous material at the MOL or BEOL processing levels is required. The low-k dielectric, porous material, e.g., SiCOH or p-SiCOH, is widely used in advanced CMOS technologies such as 90 nm and smaller generations for several BEOL wiring levels.

Particularly useful in these low-k dielectric, porous applications is a guard ring to prevent moisture ingress which can cause SiCOH cracking or degraded copper reliability (e.g., electromigration, stress migration, etc.). But the use of a segmented guard ring can cause reliability fails in these low-k dielectric, porous applications. Accordingly, RFSOI chips with segmented guard ring and low-K SiCOH or p-SiCOH MOL/BEOL are known to be incompatible.

SUMMARY

In an aspect of the disclosure, a structure comprises: a guard ring structure formed in a low-k dielectric material; and an edge seal structure formed through the low-k dielectric material to at least a substrate underneath the low-k dielectric material.

In an aspect of the disclosure, a structure comprises: a silicon on insulator substrate; a middle of the line and back end of the line dielectric low-k dielectric material on the silicon on insulator substrate; a wiring structure formed in the middle of the line and back end of the line dielectric low-k dielectric material to the silicon on insulator substrate; a segmented guard ring structure formed in the middle of the line and back end of the line dielectric low-k dielectric material; and an edge seal structure formed extending through the middle of the line and back end of the line dielectric low-k dielectric material.

In an aspect of the disclosure, a method comprises: forming a middle of the line and back end of the line dielectric low-k dielectric material on the silicon on insulator substrate; forming a wiring structure formed in the middle of the line and back end of the line dielectric low-k dielectric material to the silicon on insulator substrate; forming a segmented guard ring structure formed in the middle of the line and back end of the line dielectric low-k dielectric material; and forming an edge seal structure extending through the middle of the line and back end of the line dielectric low-k dielectric material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to segmented guard-ring and chip edge seals and methods of manufacture. More specifically, the present disclosure provides segmented guard-ring and chip edge seals with low-K dielectric material in middle of the line (MOL) and/or back end of the line (BEOL) processing. Advantageously, the present disclosure provides compatibility of segmented guard ring with RFSOI chips comprising low-K SiCOH or p-SiCOH MOL/BEOL materials and fabrication processing.

In embodiments, the chip edge sealing structures can be provided in a final passivation nitride/polyimide film, which requires only one mask. This chip edge sealing structure can eliminate the front end of the line (FEOL) buried silicon on insulator (SOI) contact or edge seal, which is filled with a semiconductor or conductor, which connects the SOI top silicon with the silicon handle wafer through the buried oxide (BOX) contact in current SOI technologies, and can be used in advanced CMOS technologies (e.g., 14 nm) with non-segmented guard ring designs.

In further embodiments, a chip edge sealing structure can be provided post metal-insulator-metal (MIM) plate formation and prior to via interlevel dielectric (ILD) deposition. In this implementation, a thick ILD oxide deposition can be used to fill a trench to form the chip edge sealing. In yet another embodiment, the chip edge sealing structure can be provided with an airgap. In this implementation, a single airgap mask can be used, shared during low Coff SOI switch formation. In addition, in this implementation a thin (e.g., approximately 5 nm) layer of material, e.g., $Al_2O_3$, can be provided for optimal moisture barrier protection. Advantageously, the processes and resultant structure provided herein can eliminate the use of an optional FEOL buried layer isolation edge seal discussed above. In addition, the edge seal structure can be used with both a segmented and non-segmented guard ring structures.

The guard-ring and chip edge seal structures of the present disclosure can be manufactured in a number of ways using a number of different tools. In general, though, the methodologies and tools are used to form structures with dimensions in the micrometer and nanometer scale. The methodologies, i.e., technologies, employed to manufacture the guard-ring and chip edge seal structures of the present disclosure have been adopted from integrated circuit (IC) technology. For example, the structures are built on wafers and are realized in films of material patterned by photolithographic processes on the top of a wafer. In particular, the fabrication of the guard-ring and chip edge seal structures uses three basic building blocks: (i) deposition of thin films of material on a substrate, (ii) applying a patterned mask on top of the films by photolithographic imaging, and (iii) etching the films selectively to the mask.

Figure 1A:
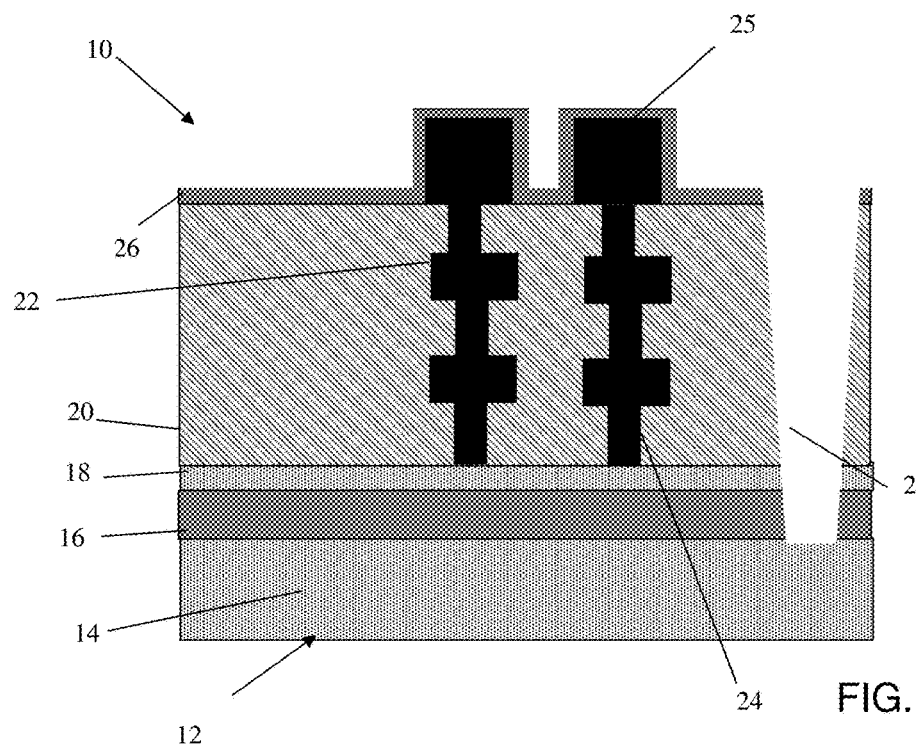
FIGS. 1A-1C show structures and respective fabrication processes in accordance with aspects of the present disclosure.
Figure 1B:
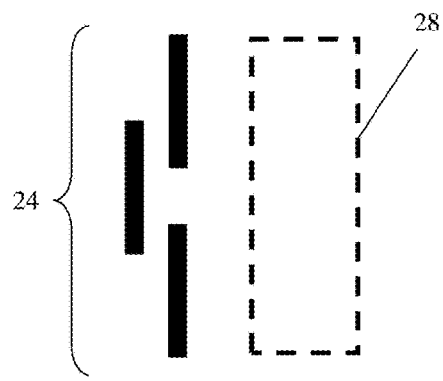
Figure 1C:
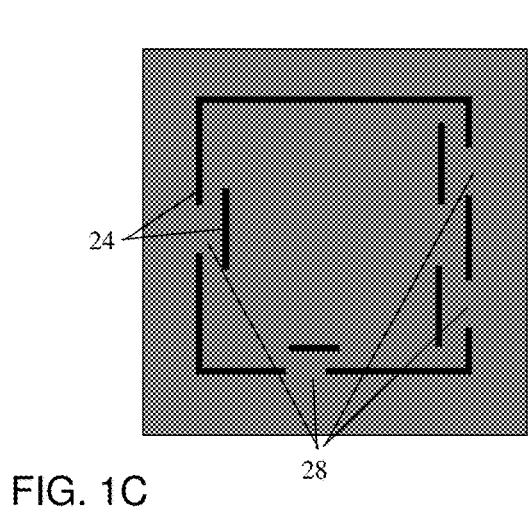
Figure 2:
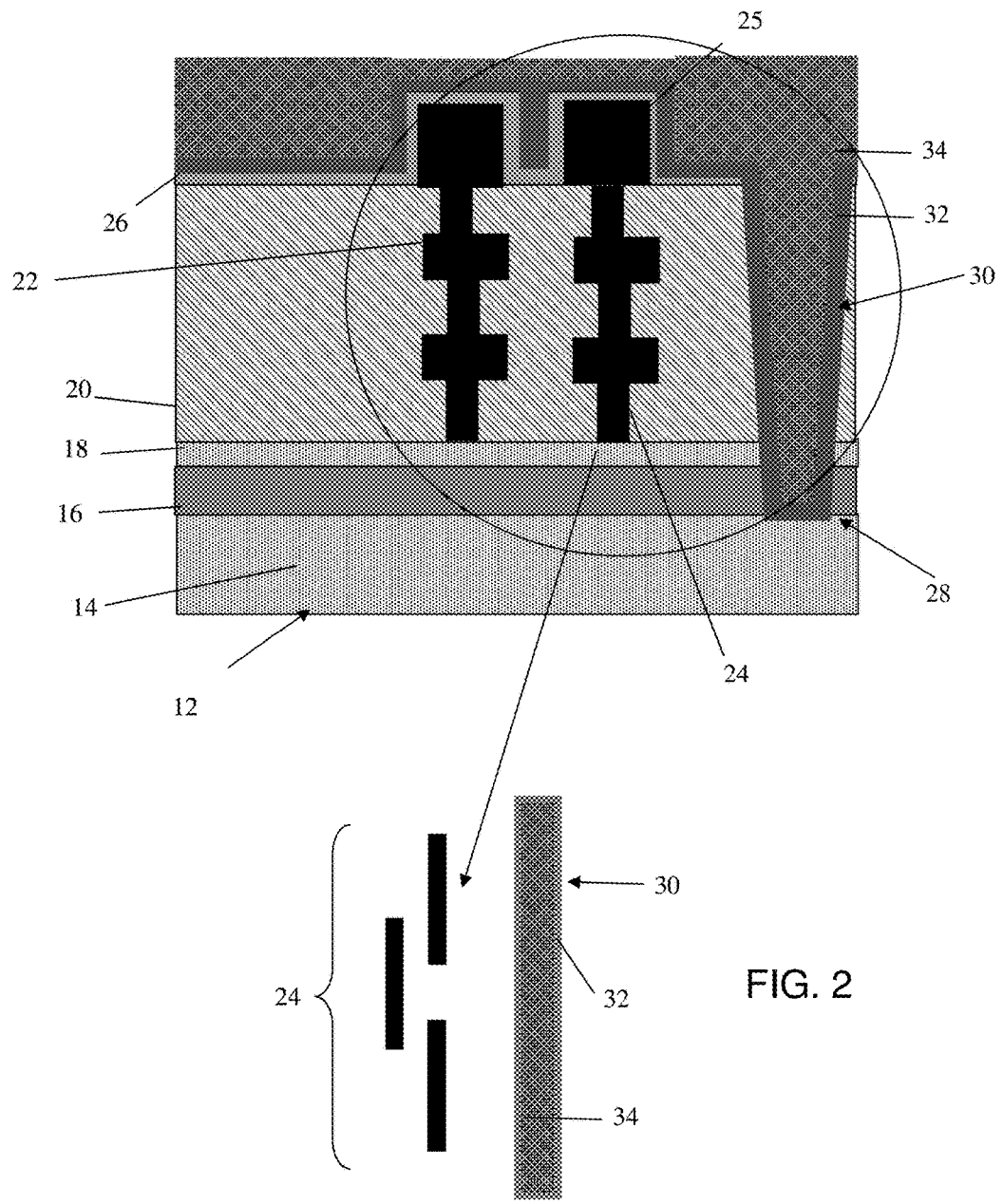
FIG. 2 shows an edge seal structure, amongst other features, and respective fabrication processes in accordance with aspects of the present disclosure.

FIGS. 1A-1C show structures and respective fabrication processes in accordance with aspects of the present disclosure. FIG. 1A is a cross-sectional view of the structure and FIG. 1C is a top view of the structure shown in FIG. 1A. FIG. 1B is a partially exploded view of a guard ring structure and trench formed in a low-k dielectric material. As shown in FIG. 2, for example, the trench is filled with material chip edge seal.

In particular, the structure 10 shown in FIGS. 1A-1C includes a silicon-on-insulator (SOI) substrate 12. In embodiments, the SOI substrate 12 includes a handle wafer 14 and a buried insulator layer 16 under a semiconductor layer 18. In embodiments, the buried insulator layer 16 can be silicon dioxide or sapphire; however, it should be understood that the choice of insulator and handle wafer depends largely on the intended application. For example, for layer 16, sapphire is used for high-performance radio frequency (RF) and radiation-sensitive applications; whereas, silicon dioxide is used for diminished short channel effects in microelectronics devices, as examples. In embodiments, handle wafer 14 can be silicon or sapphire. The semiconductor layer 18 may be composed of any suitable semiconductor material including, but not limited to, Si, SiGe, SiGeC, SiC, GaAs, InAs, InP, etc. The SOI substrate 12 can be formed by any conventional fabrication processes, e.g., wafer bonding, Separation by IMplantation of OXygen (SiMOX), etc.

Still referring to FIGS. 1A-1C, a low-k dielectric material 20 is formed over the semiconductor layer 18 in MOL and/or BEOL processes. In embodiments, the low-k dielectric material 20 can be a non-porous or porous polymer, carbon doped oxide, or oxide or combinations thereof, deposited using conventional deposition methods. In more specific embodiments, the low-k dielectric material 20 can be low-K SiCOH or porous-SiCOH materials. The low-k dielectric material 20 can be deposited by a chemical vapor deposition process.

A plurality of conductive wiring and via structures 22 (herein after referred to generally as wiring structure) and guard ring structure 24 are formed in the low-k dielectric material 20 to the semiconductor layer 18. The wires or vias could be formed either in low-k or oxide intermetal dielectrics with one or more of the wires or vias formed in low k dielectric. The guard ring structure 24 is preferably a segmented guard ring structure formed from metal vias and wiring layers, positioned near an edge of the chip. The guard ring structure 24 can be segmented to reduce rf coupling. More specifically, the guard ring structure 24 is a metal structure formed outside of the wiring structure 22 near an edge of the chip using conventional damascene or dual damascene processes. The wiring structure 22 can also be formed by conventional damascene or dual damascene processes.

By way of example, the wiring structure 22 and segmented guard ring structure 24 can be formed using conventional deposition, lithography and etching processes (e.g., damascene or dual damascene processes). Specifically, after each layer of low-k dielectric material 20 is deposited, a resist deposited on a surface of the low-k dielectric layer 20 is exposed to energy (light) to form a pattern (opening). An etching process with a selective chemistry, e.g., reactive ion etching (RIE), will be used to form one or more vias and trenches in the low-k dielectric material 20 through the openings of the resist. In embodiments, the lithography and etching step can be a single or damascene process. The resist can then be removed by a conventional oxygen ashing process or other known stripants. Following the resist removal, conductive material, e.g., copper, aluminum, tungsten, etc., is deposited in the vias and trenches by conventional deposition processes, e.g., chemical vapor deposition (CVD) processes. Any residual metal material on the surface of the low-k dielectric material 20 can be removed by conventional chemical mechanical polishing (CMP) processes. This process continues until all of the wiring layers (e.g., M1 level, M2 level, etc.) are formed.

FIGS. 1A-1C further show a last metal layer or bond pad 25 formed in electrical and direct contact with at least the wiring structure 22 and the guard ring structure 24. The last metal layer or bond pad 25 can be formed by any subtractive method, as an example. Illustratively, in the implementation of the bond pad, an aluminum material can be deposited on the surface of the low-k dielectric material 20, followed by a patterning and etching process (e.g., lithography and RIE process). An oxide and/or nitride layer 26 is formed over the last metal layer or bond pad 25 and any exposed surfaces of the low-k dielectric material 20. The oxide layer 26 can be deposited by a plasma enhanced (PE) CVD process to a thickness of about 0.5 microns; although other dimensions are also contemplated by the present disclosure.

Still referring to FIGS. 1A-1C, a trench 28 is formed through the layers of the structure 10 and preferably below the low-k dielectric material 20. In more specific embodiments, the trench 28 is formed through the low-k dielectric material 20 and extends to the semiconductor layer 18 and even more preferably to the buried insulator layer 16 or underneath the buried insulator layer 16. The trench 28 can have a width of about 2 microns; although other dimensions are contemplated herein. In embodiments, the trench 28 can be formed by conventional lithography and etching processes as should be understood by those of skill in the art.

As shown in FIG. 2, the trench 28 will be used to form an edge seal structure 30, at an outermost portion of the chip with respect to the wiring structure 22 and the guard ring structure 24. More specifically, the edge seal structure 30 is formed by deposition of materials within the trench 28. For example, the edge seal structure 30 includes a thin passivation layer 32, e.g., about 0.5 microns, formed on the sidewalls of the trench 28. In embodiments, the passivation layer 32 can be an oxide material or a nitride material or combinations thereof, deposited by a conventional PECVD process. The PECVD process will also deposit the passivation layer 32 over the oxide layer 26. Following the deposition of the passivation layer 32, a polyimide film is deposited within the remaining portions of the trench 28, e.g., filling the trench 28. The polyimide or other polymer film 34 used for the final passivation on the wafer film 34 can be a spin on organic material (or other material). The films 32 and/or 34 should be impermeable to water to prevent water or moisture ingress through the low k material into the chip.

In this way, the processes and resultant structure provided herein eliminates the use of an optional front end of the line (FEOL) buried layer isolation edge seal. In addition, the edge seal structure 30 can be used with both a segmented and non-segmented guard ring structure 24.

Figure 3:
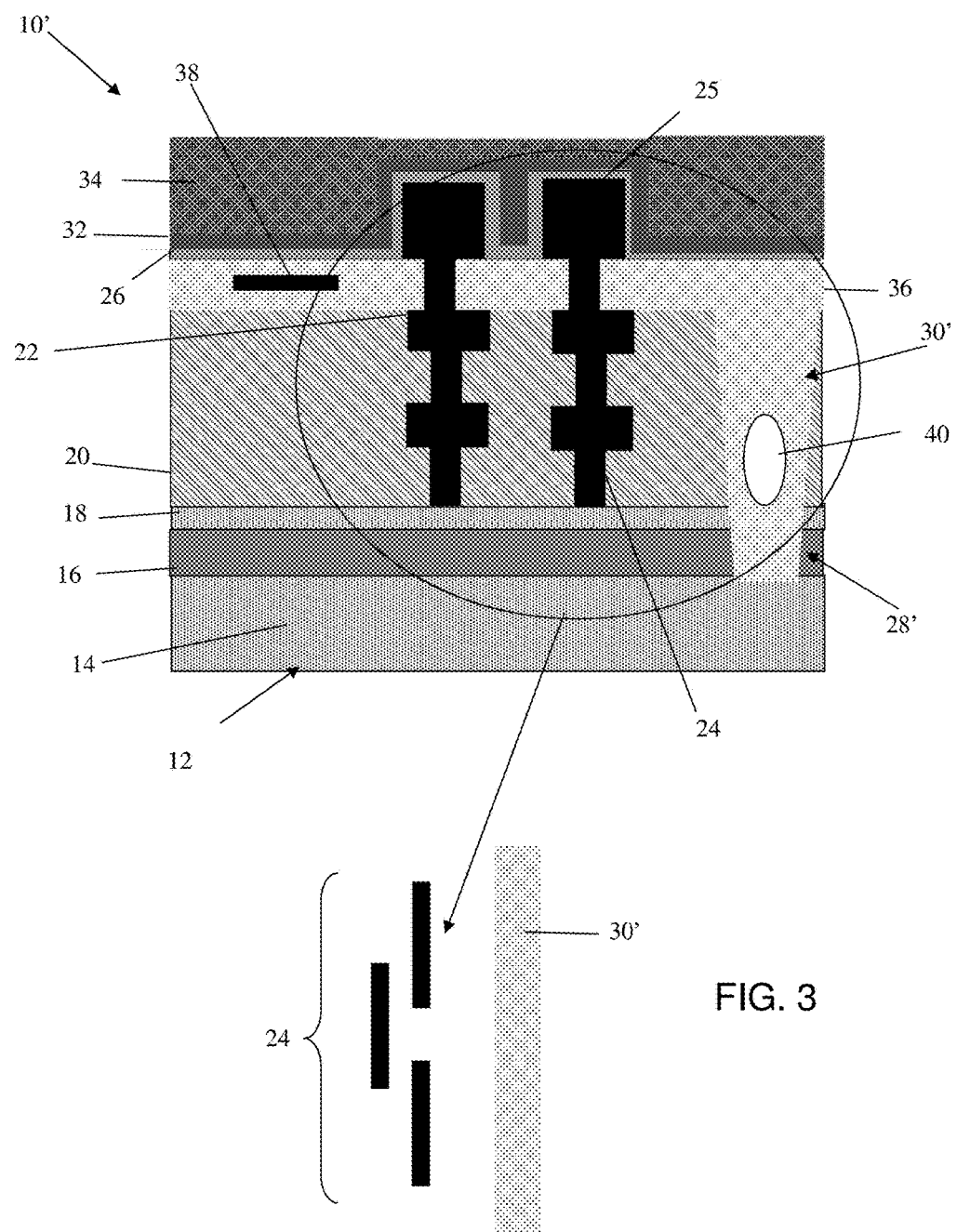
FIG. 3 shows a structure and respective fabrication processes in accordance with additional aspects of the present disclosure.

FIG. 3 shows a structure and respective fabrication processes in accordance with additional aspects of the present disclosure. In the structure 10' of FIG. 3, the edge seal structure 30' is formed from an oxide or nitride material 36, after the fabrication of a metal insulator metal (MIM)

capacitor structure 38 and several layers of the wiring structure 22 and the guard ring structure 24, e.g., M1 and M2 levels of the wiring structure 22 and the guard ring structure 24. The MIM capacitor structure 38 could be any BEOL passive device, such as a thin film resistor or a wire. As in the previous aspect, the wiring structure 22 and the guard ring structure 24 are formed to the semiconductor layer 18.

By way of more specific example of the embodiment of FIG. 3, after formation of the MIM or other passive structure 38, a trench 28' is formed through the layers of the structure 10' and preferably through and below the low-k dielectric material 20. In more specific embodiments, the trench 28' is formed through the low-k dielectric material 20 and extends to the semiconductor layer 18 and even more preferably to the buried insulator layer 16 or underneath the buried insulator layer 16. In embodiments, the trench 28' can be formed by conventional lithography and etching processes as should be understood by those of skill in the art. As in the previous embodiments, the trench 28' can have a width of about 2 microns; although other dimensions are contemplated herein.

After formation of the trench 28', oxide and/or nitride material 36 is deposited over the MIM structure 38 and within the trench 28' using a conventional CVD, physical vapor deposition, or similar process. In embodiments, the deposition of oxide may result in a pinch-off of the material 36 within the trench 28'. This pinch-off, in turn, will form an airgap 40 within the trench 28'. Accordingly, the airgap 40 has a smaller dimension than the filled trench 28'. The oxide material can undergo an optional CMP process, resulting in a planar surface for additional processing as noted herein. In this way, the edge seal structure 30' will be positioned at an outermost portion of the chip with respect to both the wiring structure 22 and the segmented guard ring structure 24.

Still referring to FIG. 3, the upper portions (e.g., the third or above metal wire/via levels) of the wiring structure 22 and the segmented guard ring structure 24 can be formed on the planarized oxide or nitride material 36 using conventional lithography, etching and deposition processes. The last metal layer or bond pad 25 is formed in electrical and direct contact with at least the wiring structure 22 and the guard ring structure 24. The last metal layer, shown as the third metal layer in FIG. 3, or bond pad 25 can be formed by any subtractive method as described herein. The dielectric layer 26 is formed over the last metal layer or bond pad 25 and any exposed surfaces of the low-k dielectric material 20. The oxide layer 26 can be deposited by a PECVD process to a thickness of about 0.5 microns; although other dimensions are also contemplated by the present disclosure. A thin passivation layer 32, e.g., about 0.5 microns, is formed over the oxide layer 26 and a polyimide or other optional polymer film 34 is deposited on the passivation layer 32. The polyimide film 34 can be a spin on organic material (or other material).

Figure 4:
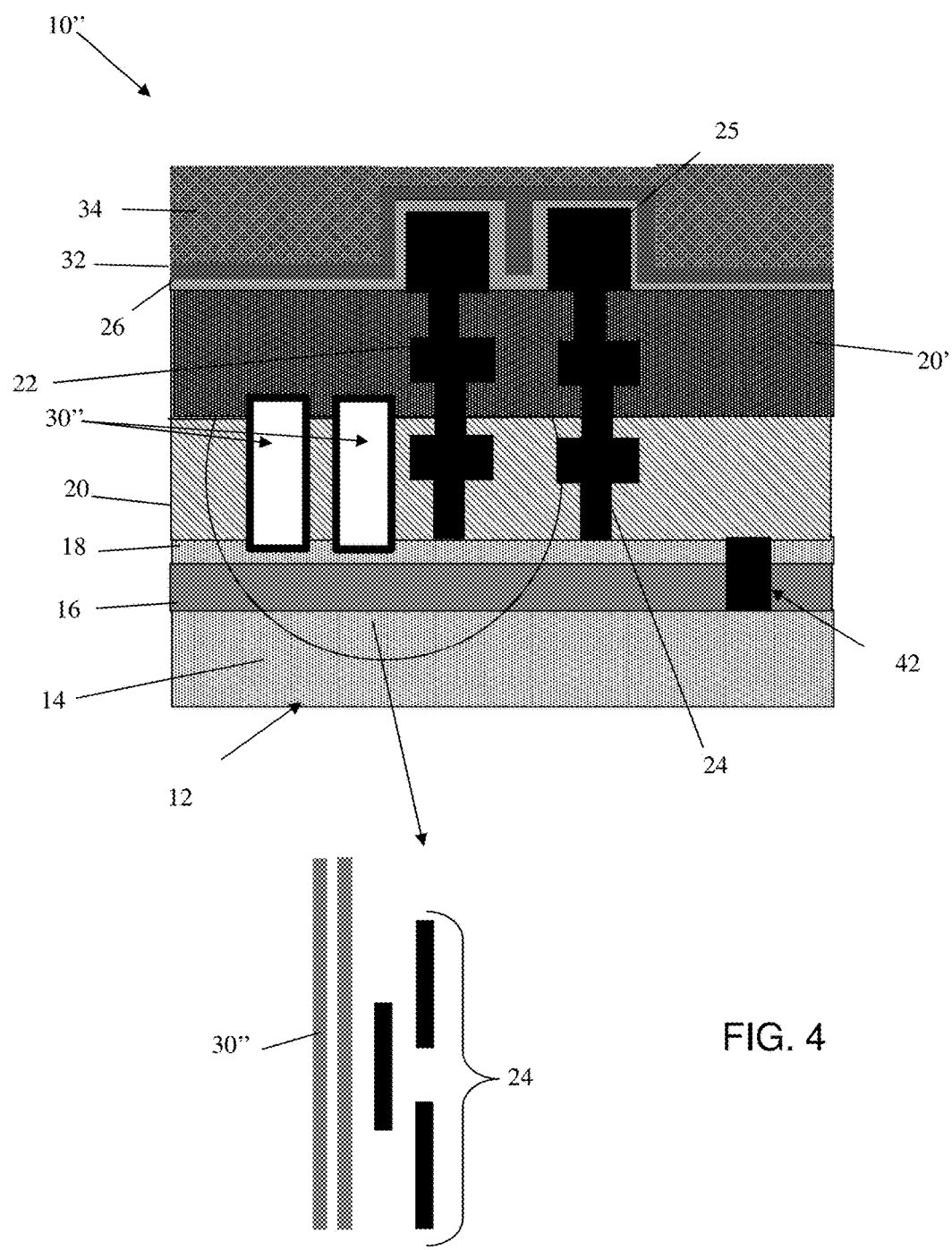
FIG. 4 shows a structure and respective fabrication processes in accordance with additional aspects of the present disclosure.

FIG. 4 shows a structure and respective fabrication processes in accordance with additional aspects of the present disclosure. In the structure 10" of FIG. 4, an airgap or oxide lined airgap 30" can be formed in the low-k dielectric material 20. For example, after forming a first or multiple levels of the wiring structure 22 and the segmented guard ring structure 24 in the low-k dielectric material 20, e.g., SiCOH, using single or dual damascene processes, a trench is formed into the low-k dielectric material 20 to a segmented opening in the segmented guard ring 24. In embodiments, the trench is formed using conventional lithography and etching (RIE) processes as already described herein. The trench can be filled with an oxide material until it becomes pinched-off, thereby creating the airgap 30" or can be completely filled with oxide. For example, a PECVD silane oxide can be deposited within the trench to form the airgap 30". In this way, the airgap 30" can be formed at the M1 level (lower level) of the wiring structure 22. Two parallel airgaps 30" are show for example but any number of airgaps, e.g., one or more, may be employed and the top view layout of the airgaps could be rectangular (shown), circular, polygonal, etc.

After formation of the airgap 30", an oxide material can blanket deposited above the airgap 30" to form an interlevel dielectric layer 20'. In embodiments, the interlevel dielectric layer 20' is not a low-k dielectric material 20. The remaining wiring structures can be fabricated in the manner already described herein, including upper levels of the wiring structure 22 (M2 level and above) and the segmented guard ring structure 24, as well as the last metal layer or bond pads 25, etc. For example, by using lithography, etching and deposition steps, as described herein, the upper wiring structures, e.g., M2 level and above, can be fabricated in the dielectric layer 20'.

In alternative embodiments of FIG. 4, a dual damascene wiring structure 22 and segmented guard ring structure 24 is formed in the MOL in the low-k dielectric material 20, e.g., SiCOH, following by deposition of an NBLoK 20', e.g., SiCxNyHz, over the dual damascene wiring structure 22 and segmented guard ring structure 24. A trench is formed into the low-k dielectric material 20 (and NBLoK 20') to a segmented opening in the segmented guard ring 24. In embodiments, the trench is about 0.3 µm wide; although other dimensions are contemplated herein. In embodiments, a trench can already be etched down to PC in NFET switches to form an airgap, e.g., about 0.18 µm deep trench. A PECVD silane oxide is then deposited to pinch off an airgap 30". In an addition implementation, a thin (e.g., approximately 5 nm) layer of material 42, e.g., $Al_2O_3$, can be provided in the semiconductor layer 18 and insulator layer 16 for perfect moisture barrier protection (at an outermost portion of the chip). The remaining structure 10" can be fabricated in the manner already described herein, including upper portions of the wiring structure 22 (e.g., M2 level and above) and the segmented guard ring structure 24 in the low-k dielectric material 20, as well as the last metal layer or bond pads 25, etc. Alternatively, if the low k dielectric is used for multiple wiring level, then the airgap would extend through the same multiple wiring levels.

Figure 5A:
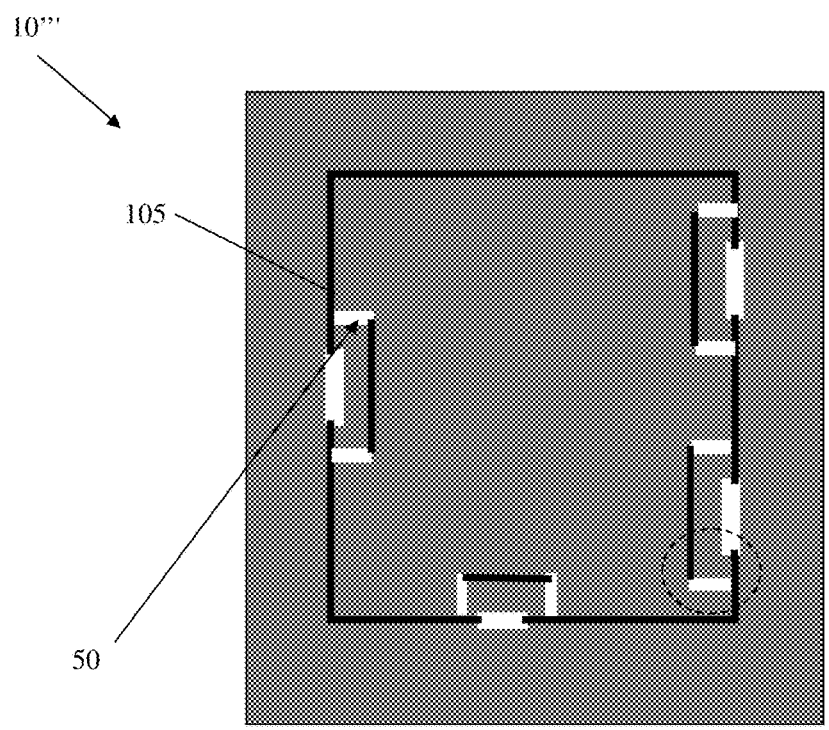
FIGS. 5A-5D show structures and respective fabrication processes in accordance with additional aspects of the present disclosure.
Figure 5B:
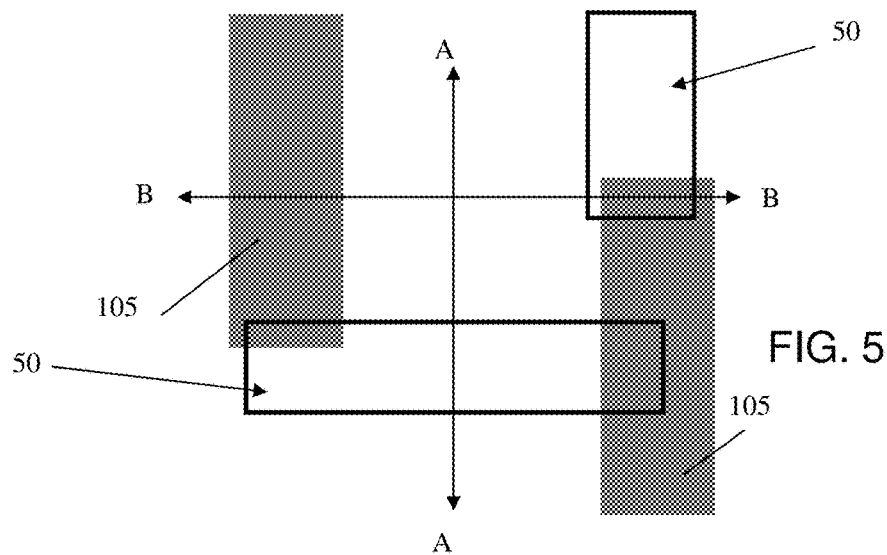
Figure 5C:
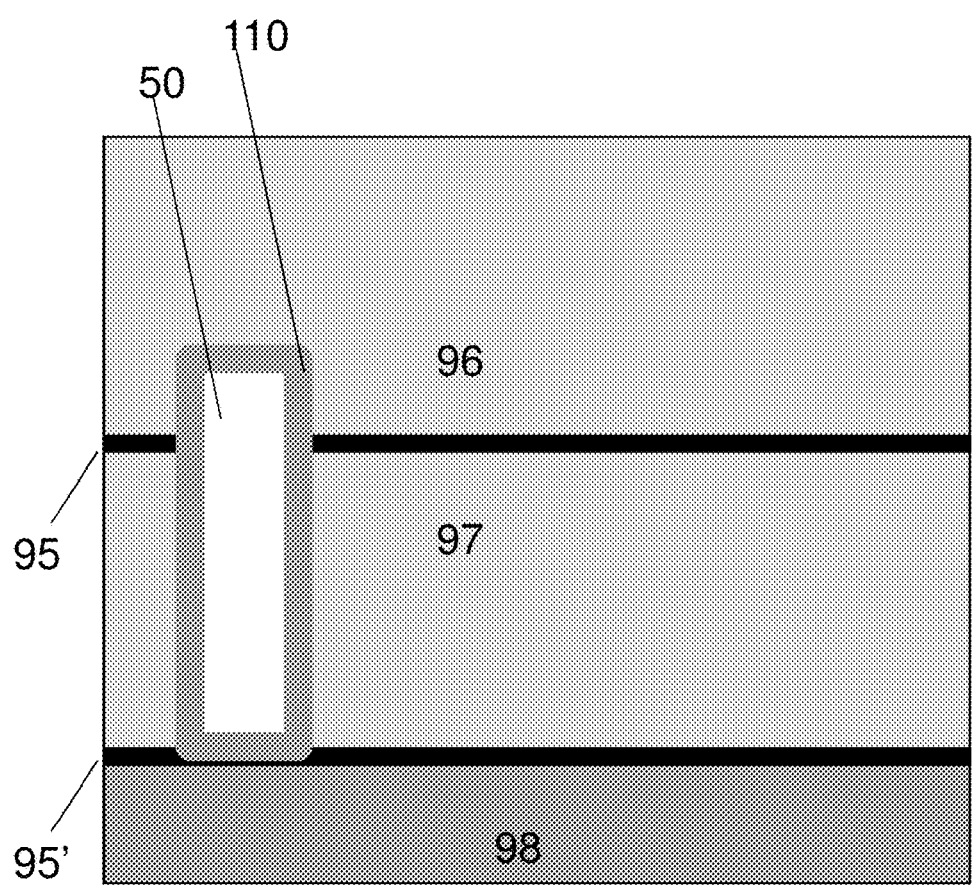
Figure 5D:
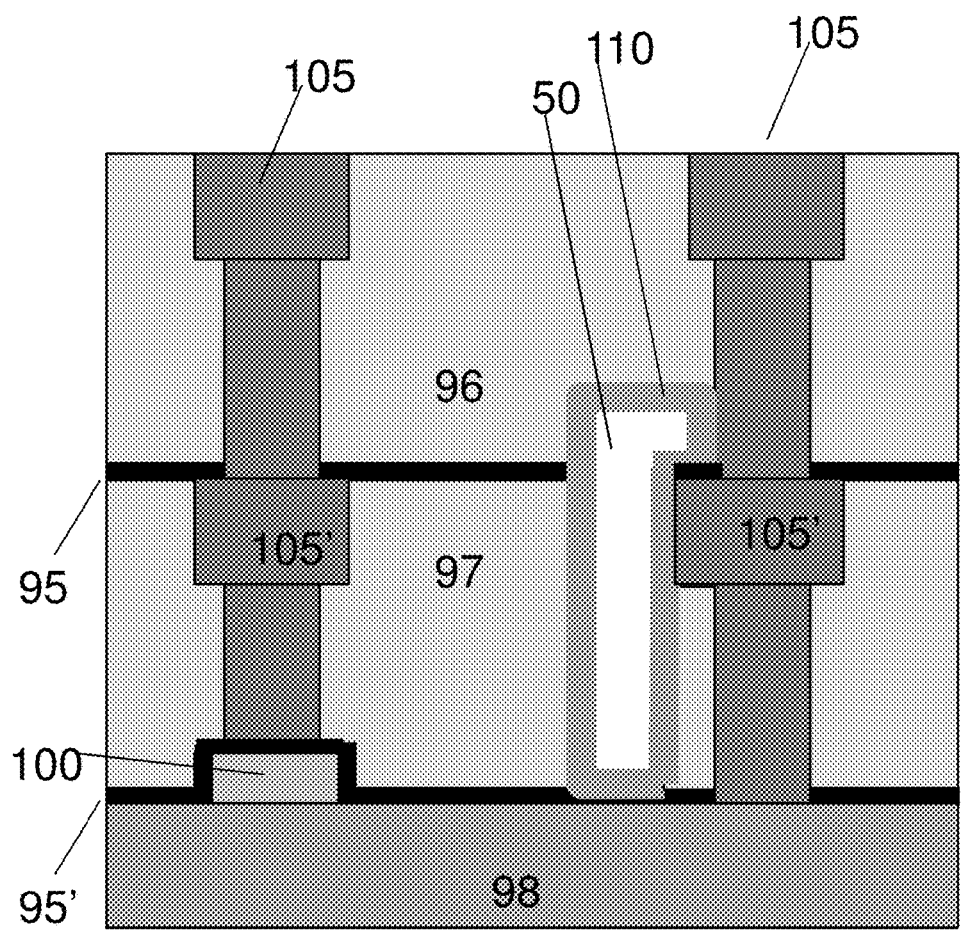

FIGS. 5A-5D show different views of structures and respective fabrication processes in accordance with additional aspects of the present disclosure. In addition, more details Specifically, FIG. 5A is top view of a chip edge seal and segmented guard ring structure. FIG. 5B is an exploded view of the structures shown in FIG. 5B, and FIGS. 5C and 5D are cross-sectional views along lines A-A and B-B, respectively, of FIG. 5B.

In particular, FIGS. 5A-5D show a structure 10''' comprising an airgap 50 preferably placed over and touching substrate 98 or feature 105 on the substrate 98 such as a FET, resistor, capacitor, etc. formed on the silicon substrate and, more particularly, landing on a nitride film 95' over the substrate 98 or feature 100 (FIG. 5C). When specifying the airgap touching substrate 98 or feature 100, this means touching or etching into nitride layer 95' so that there is no low k dielectric 97 left under the airgap. The nitride layer 95' could be composed of any non-low-K dielectric, such as oxide, SiC, SiCN, etc. For the option of landing the trench etch on the feature 100, the trench etch, e.g., RIE, used in the fabrication process of the airgap 50 can be shallower, hence saving time and manufacturing costs. In embodiments, the airgap 50 can also land on other locations of the structure or can be etched into the substrate 98.

The airgap 50, as with the other aspects of the present disclosure forming the edge seal structure, is provided in a low-k dielectric material 20, e.g., SiCOH (FIGS. 5A-5D). The airgap 50 can be lined with an oxide material 110, which also is used for, e.g., an upper wiring level (e.g., M2 wiring layer) over the low-k dielectric material 20 (FIGS. 5C-5D). The airgap 50 can be partially or completely filled with oxide 110. The airgap 50 can be about 180 nm wide, formed by a pinch-off process as is known to those of skill in the art. For example, the airgap 50 can be formed by depositing nitride material 95 over the previously formed first level wires 105 that form both the crack stop and the other wires on the chip, followed by an oxide material 95 used to form wires and vias for the next wiring level. This nitride 95' and oxide 96 are deposited over a the wires and crack stop formed in the low-k dielectric material 97. The oxide 96 and nitride 95 can be deposited using, e.g., PECVD processes. As shown in FIG. 5D, the airgap 50 be positioned partially over at least one side of a wiring structure 105', e.g., segmented guard ring structure. In this way, the air gaps 50 extending on both sides and between the wiring structure 105 forming an edge seal structure. In embodiments, the wiring structure 105 can be a contact for a first metal layer (e.g., M1 layer).

FIGS. 5A-5D show the low-k dielectric formed for the first wire level and contact below it. The low-k dielectric layer could be used for any one or more wire, contact, or via levels with the airgap extending completely through the low k dielectric layers. FIG. 5C shows the oxide 110 lined airgap 50 extending from the oxide layer 96 to the nitride layer 95' over substrate 98. FIG. 5D shows the oxide 110 lined airgap 50 landing partially on crack stop first metal layer 105' and also landing on nitride layer 95' Again, the airgap is completely isolating the low k dielectric 97.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a guard ring structure formed in a low-k dielectric material; and
an edge seal structure formed through the low-k dielectric material to at least a substrate underneath the low-k dielectric material,
wherein the substrate is a silicon on insulator substrate and the edge seal structure terminates below the low-k dielectric material.

2. The structure of claim 1, wherein the low-k dielectric material is low-K SiCOH or p-SiCOH middle of the line and/or back end of the line dielectric material.

3. The structure of claim 1, wherein the guard ring structure is a segmented guard ring structure.

4. The structure of claim 3, wherein the edge seal structure is a trench lined with a passivation layer and filled with a polyimide.

5. The structure of claim 4, wherein the polyimide is planarized above a last metal layer or bond pad.

6. The structure of claim 1, wherein the edge seal structure is a trench filled with oxide material which is also covering a metal insulator metal structure.

7. The structure of claim 6, wherein the trench filled with the oxide is below a last metal layer or bond pad.

8. The structure of claim 7, wherein the trench filled with the oxide includes an airgap.

9. A structure comprising:
a guard ring structure formed in a low-k dielectric material; and
an edge seal structure formed through the low-k dielectric material to at least a substrate underneath the low-k dielectric material,
wherein the edge seal structure is one or more airgaps formed in the low-k dielectric material that is pinched off with oxide.

10. The structure of claim 9, wherein the oxide is a PECVD silane oxide.

11. A structure comprising:
a silicon on insulator substrate;
a middle of the line and back end of the line dielectric low-k dielectric material on the silicon on insulator substrate;
a wiring structure formed in the middle of the line and back end of the line dielectric low-k dielectric material to the silicon on insulator substrate;
a segmented guard ring structure formed in the middle of the line and back end of the line dielectric low-k dielectric material; and
an edge seal structure formed extending through the middle of the line and back end of the line dielectric low-k dielectric material.

12. The structure of claim 11, wherein the edge seal structure is a trench lined with a passivation layer and filled with a polyimide which has a planarized surface above a last metal layer or bond pad.

13. The structure of claim 12, wherein the edge seal structure terminates below the middle of the line and back end of the line dielectric low-k dielectric material.

14. The structure of claim 11, wherein the edge seal structure is a trench filled with oxide material which covers a metal insulator metal structure below a last metal layer or bond pad.

15. The structure of claim 14, wherein the trench filled with the oxide includes an airgap.

16. The structure of claim 11, wherein the edge seal structure is one or more airgaps formed in the low-k dielectric material.

17. The structure of claim 16, wherein the one or more airgaps are at a lower level of the wiring structure.

18. The structure of claim 16, wherein the one or more airgaps are pinched off with PECVD silane oxide.

* * * * *